(12) United States Patent
Naeini et al.

(10) Patent No.: US 9,300,020 B2
(45) Date of Patent: Mar. 29, 2016

(54) FILTERLESS BROADBAND FRONT-END ISOLATOR

(71) Applicant: Intel Deutschland GmbH, Neubiberg (DE)

(72) Inventors: Ashkan Naeini, Munich (DE); Stefan Herzinger, Sauerlach (DE)

(73) Assignee: Intel Deutschland GmbH, Neubiberg (DE)

( * ) Notice: Subject to any disclaimer, the term of this patent is extended or adjusted under 35 U.S.C. 154(b) by 0 days.

(21) Appl. No.: 14/311,495

(22) Filed: Jun. 23, 2014

(65) Prior Publication Data

US 2015/0372360 A1    Dec. 24, 2015

(51) Int. Cl.
*H01P 1/18* (2006.01)
*H01P 5/12* (2006.01)
*H01P 1/36* (2006.01)

(52) U.S. Cl.
CPC .. *H01P 1/18* (2013.01); *H01P 1/36* (2013.01); *H01P 5/12* (2013.01)

(58) Field of Classification Search
CPC ................................... H01P 1/18; H01P 1/36
USPC .............. 333/24.1, 24.2, 117, 118, 119, 120; 455/73, 80, 82, 83, 84
See application file for complete search history.

(56) References Cited

U.S. PATENT DOCUMENTS 5,304,999 A * 4/1994 Roberts ................ H01Q 21/245
333/117

* cited by examiner

*Primary Examiner* — Stephen E Jones
(74) *Attorney, Agent, or Firm* — Schwegman Lundberg & Woessner, P.A.

(57) ABSTRACT

Representative implementations of devices and techniques provide isolation between transmit and receive portions of a broadband transceiver of a wireless communication system. filterless isolation technique is performed via a directional Phase shifting arrangement that includes an isolating hybrid device coupled to a non-reciprocal phase shifting combiner/splitter.

21 Claims, 5 Drawing Sheets

FILTERLESS BROADBAND FRONT-END ISOLATOR

BACKGROUND

Global radio spectrum acquisition has resulted in the heavy use of several frequency bands for certain communication standards. Modern cellular communication often demands a multi-band approach to radio frequency (RF) transceivers. For example, a RF engine of a transceiver can be designed to switch, using "software-defined" switches, between different receive bands. Communication systems using a frequency-division duplexing (FDD) mode, or the like, can be more affected by the use of multi-band spreading, since their seamless duplex communication relies on a minimum isolation of receive (Rx) and transmit (Tx) paths.

One approach to providing front-end isolation between the Tx and Rx is based on using a duplexer. A duplexer includes two narrowband band-pass filters with a very-high quality factor. The duplexer attempts to provide the desired Tx to Rx isolation by passing receive and transmit bands through pass-band filters with a very sharp flank. The required high-Q filter can be achieved by special and often expensive process technologies, like surface or bulk acoustic waves (SAW/BAW) technologies, for example. However, the narrowband characteristic of the filter and its lack of tunablility allows the application of one duplexer for each band. So, the quantity of duplexers and associated input ports on a RF transceiver increases with the number of supported bands. The cost of supporting multiple bands is reflected in additional bill of materials (BOM) as well as increases in engine area and potentially the amount of RF I/O ports of chip.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

DETAILED DESCRIPTION

Overview

A broadband wireless transceiver system, such as a handheld mobile device, for example, can experience receive path interference, if there is insufficient transmit (Tx) to receive (Rx) isolation at the front-end of the transceiver. Further, it is desired that the Tx/Rx isolation be accomplished for multiple bands of the transceiver, without significantly adding to the costs of the system. Representative implementations of devices and techniques provide isolation between transmit and receive portions of a broadband transceiver of a wireless communication system, without the use of filter-based duplexers. In an implementation, phase shifting techniques are performed via a filterless isolation arrangement that includes an isolating hybrid device coupled to a non-reciprocal phase shifting combiner/splitter.

In an example, the (passive) hybrid device naturally isolates the Tx (e.g., power amplifier (PA), etc.) from the Rx (e.g., low noise amplifier (LNA), etc.) by locating each on opposite sides of hybrid device ports, such as a hybrid coil isolation transformer, or the like. But consequently the hybrid device loses the Tx and Rx signal powers by its principal splitting and phase shifting of incoming signals.

In another example, the non-reciprocal phase shifting combiner/splitter provides signal splitting/combining with a dedicated directional phase shifting of signals, as a coupler to the antenna. In an implementation, the hybrid device and the non-reciprocal phase shifting combiner/splitter work together, splitting and combining signals with proper shifting the phase of dedicated signal portions, to provide broadband front-end isolation between the Tx and Rx over multiple bands to a multi-band RF transceiver. For example, these techniques can be performed as Rx signals pass from the antenna to the receive portion (e.g., LNA, etc.) of the transceiver and as Tx signals pass from the transmit portion (e.g., PA, etc.) of the transceiver to the antenna without losses.

Various implementations, including techniques and devices, are discussed with reference to the figures. The disclosure illustrates the techniques and devices with reference to a wireless communications device, such as a mobile broadband telecommunications device (e.g., cellular phone, etc.). This is not intended to be limiting. The techniques and devices discussed may be applied to any of various communication device designs, circuits, and technologies, and remain within the scope of the disclosure.

Implementations are explained in more detail below using a plurality of examples. Although various implementations and examples are discussed here and below, further implementations and examples may be possible by combining the features and elements of individual implementations and examples.

Example Environment

Figure 1:
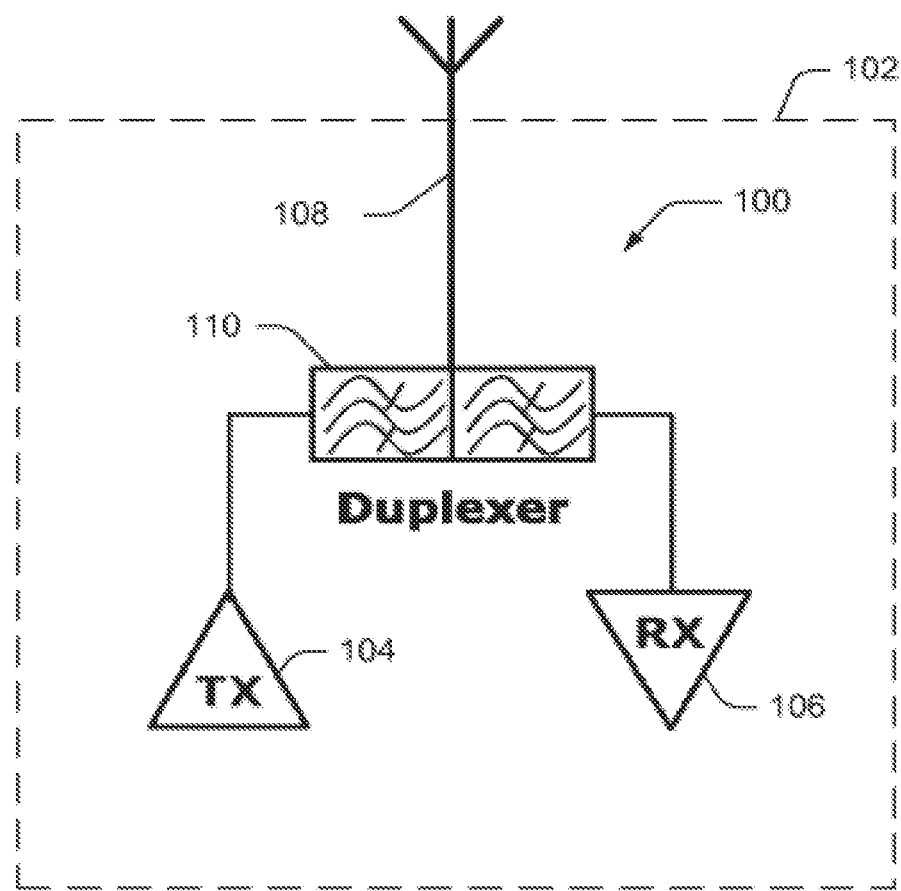
FIG. 1 is a block diagram of a portion of an example wireless communications system, in which the techniques in accordance with the present disclosure may be implemented.

FIG. 1 is a block diagram of an isolation arrangement 100 ("arrangement 100") as implemented with an example wireless communications system 102 ("system 102"), in which the techniques in accordance with the present disclosure may be implemented. In various implementations, the system 102 may comprise a broadband transceiver, such as a multi-band RF communications transceiver (e.g., cellular phone, communications or data terminal, cellular repeater, etc.), or the like. In the implementations, the isolation arrangement 100 comprises one or more components arranged to provide front-end Tx/Rx isolation to the system 102. Further, in most implementations, the system 102 includes the arrangement 100 (e.g., the arrangement 100 is integral to the system 102).

As shown in FIG. 1, the system 102 may include a Tx component 104 (e.g., PA, etc.), a Rx component 106 (e.g., LNA, etc.), and one or more antennas 108. In the example shown, the arrangement 100 includes one or more duplexers 110. As described above, a duplexer may comprise one or more sharp filters with pass-bands arranged to narrowly pass the Rx or the Tx, particularly. Accordingly, the duplexer can include one or more sharp filters for each of the Rx and Tx, to isolate the Tx and Rx bands from each other.

A degree of isolation of the Rx from the Tx can be obtained by using at least one duplexer per band. However, due to the narrowness of filter based duplexer, an additional duplexer is associated to each additional band of the system 102. Consequently, multiple duplexers as well as multiple associated ports, and/or switches are used for a system 102 with multiple bands.

Example Implementations

Figure 2A:
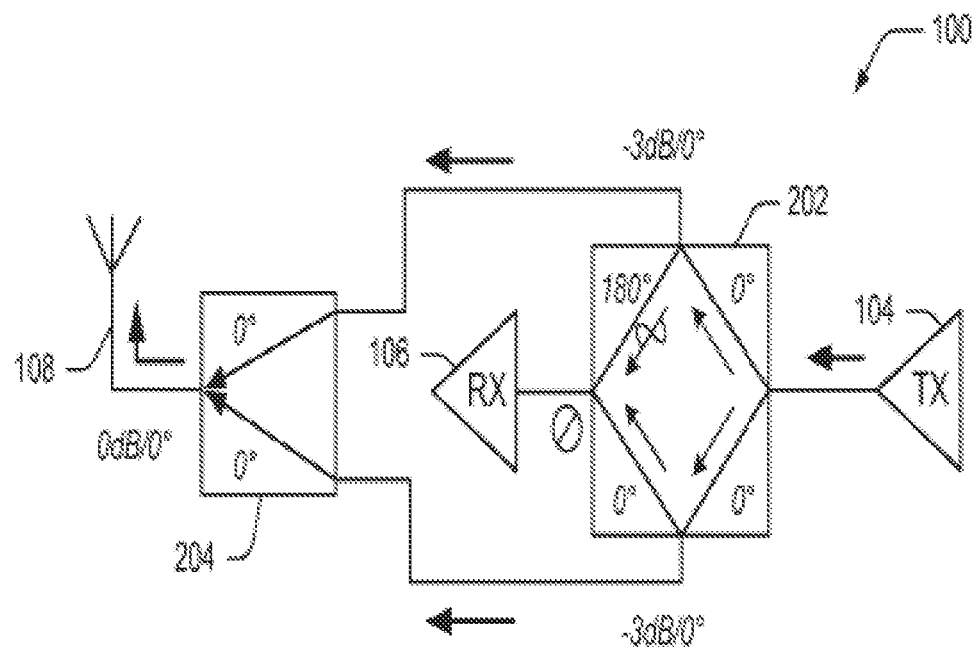
FIG. 2(a) is a block diagram of a filterless broadband isolation arrangement, according to an implementation. The diagram illustrates an example of a transmit signal passing through the arrangement.
Figure 2B:
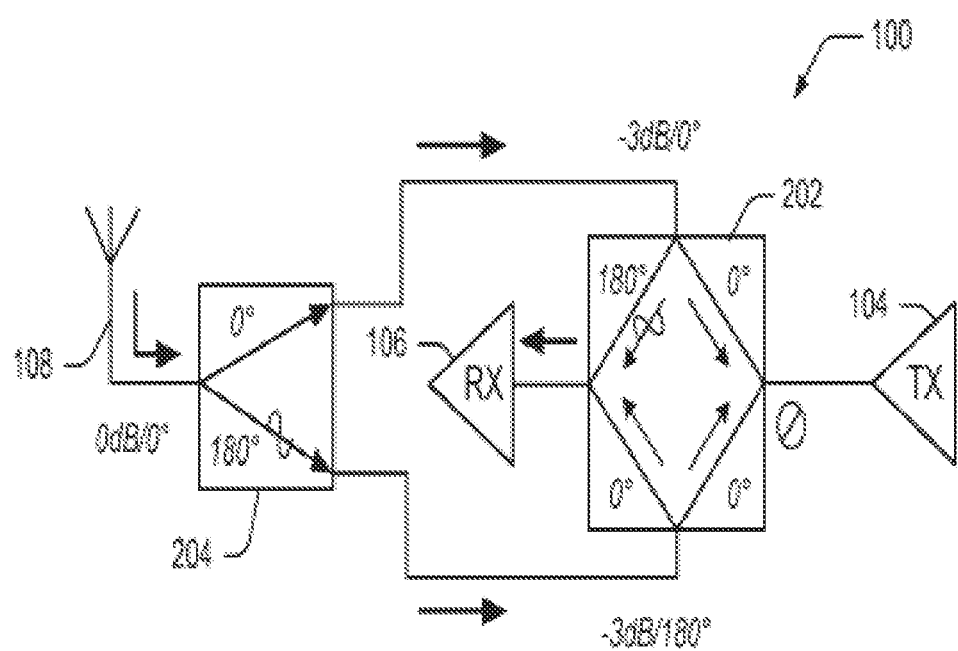
FIG. 2(b) is a block diagram of the filterless broadband isolation arrangement of FIG. 2(a), according to the implementation, showing an example of a receive signal passing through the arrangement.

FIG. 2 includes two block diagrams of a filterless broadband isolation arrangement 100, according to an implementation. FIG. 2(a) illustrates an example of a transmit signal passing through the arrangement 100 and FIG. 2(b) illustrates an example of a receive signal passing through the arrangement 100. A single arrangement 100 as shown in FIGS. 2(a) and 2(b) (and FIG. 3) may replace one or more duplexers 110 (as well as associated ports, switches, etc.) in a system 102 to provide Tx/Rx isolation for multiple bands.

In an implementation, as shown in FIGS. 2(a) and 2(b), the arrangement 100 includes a hybrid device 202 and a non-reciprocal phase shifter ("NR shifter") 204. In the example shown, the transmit component (Tx) 104 and receive component (Rx) 106 are coupled to first and second ports of the hybrid device 202, opposite from each other and isolated from each other. The NR shifter 204 is coupled to third and fourth ports of the hybrid device 202, and to the antenna 108. As shown in the diagrams of FIG. 2, some portions of the hybrid device 202 and the NR shifter 204 include a phase shift characteristic. In alternate implementations, the arrangement of the Tx 104 and Rx 106, as well as the orientation of the phase shifting portions of the hybrid device 202 and the NR shifter 204 may be altered (e.g., flipped, rotated, etc.), and maintain the functionality described herein. In various implementations, the arrangement provides Tx/Rx isolation without the use of a filter, a duplexer, or a switch.

During transmission of a transmit signal, as shown in FIG. 2(a), the Tx 104 generates a transmit signal, which enters the hybrid device 202 at a first port and is split into two in-phase signal portions, which pass to third and fourth ports of the hybrid device 202 without a phase change. The two in-phase transmit signal portions enter the NR shifter 204, which combines the signal portions, also without a phase change, and outputs the combined transmit signal to the antenna 108. For example, in an implementation, the NR shifter 204 is arranged to perform a power splitting/combining function.

In the example, as shown in FIG. 2(a), the split portions of the transmit signal are not carried to the Rx 106. In the hybrid device 202, as the two transmit signal portions are passed from the third and fourth ports to the second port (at the Rx 106), one of the two signal portions undergoes a phase change. For example, one of the signal portions may undergo a phase shift of 180 degrees from the phase of the other signal portion (opposite phase). Accordingly, the two signal portions cancel at the second port, and are not passed to the Rx 106.

In an implementation, the transmit signal portions are ideal i.e., of equal magnitude (e.g., half of the transmit signal) and have opposite polarities, and therefore cancel each other at the second port. Alternately, taking into account imperfections in the hybrid device, etc., the transmit signal portions are close enough to ideal to provide at least 60 dB of isolation between the Tx 104 and the Rx 106, without the use of a filter or a switch.

During reception of a receive signal, as shown in FIG. 2(b), the antenna 108 receives the receive signal, which is passed to the NR shifter 204. The NR shifter 204 splits the receive signal into two receive signal portions. For example, in an implementation, the NR shifter 204 comprises or is coupled to a power splitter/combiner. Due to the direction of signal travel through the NR shifter 204, one of the receive signal portions undergoes a phase change as it passes through the NR shifter 204. For example, one of the signal portions may experience a phase shift of 180 degrees from the phase of the other signal portion (opposite phase).

The two out-of-phase signal portions enter the hybrid device 202 at the third and fourth ports, as shown in the example of FIG. 2(b). In the hybrid device 202, as the two receive signal portions are passed from the third and fourth ports to the second port of the Rx 106, one of the two signal portions undergoes a phase change. For example, the other of the signal portions may undergo a phase shift of 180 degrees, or the first inverted signal portion may undergo another phase shift of 180 degrees. Either way, the result is that the two receive signal portions now are in-phase to each other. Accordingly, the two receive signal portions combine at the second port, and are passed to the Rx 106.

However, as shown in FIG. 2(b), the split portions of the receive signal are not carried to the Tx 104. In the hybrid device 202, as the two out-of-phase receive signal portions are passed from the third and fourth ports to the first port (at the Tx 104), they have opposite phases. Accordingly, the two receive signal portions cancel at the first port, and are not passed to the Tx 104.

In various implementations, the receive signal portions are of equal or nearly equal magnitude (e.g., half the receive signal, for example), and have opposite phases at the first port of the hybrid device 202 (as well as the third and fourth ports). Accordingly, the receive signal portions cancel each other out at the first port, or nearly cancel each other out (providing at least 60 dB of Tx/Rx isolation without a filter or switch).

In alternate implementations, the signal paths may include passive or active components arranged to boost or attenuate the receive signal portions and/or the transmit signal portions to control the magnitudes of one or more of the signal portions for a desired result (e.g., a desired combination, cancelation, etc.).

In an implementation, as also illustrated in FIG. 2(b), when the receive signal is split at the NR shifter 204, it becomes a differential signal, travelling on the pair of signal paths of the arrangement 100. The differential signal is not seen by the common mode Tx 104 as it passes into the hybrid device 202. However, the differential receive signal is received at differential inputs of the Rx 106, after one of the differential branches undergoes a phase shift at the hybrid device 202. This implementation is also illustrated in FIG. 3 with more clarity.

Figure 3:
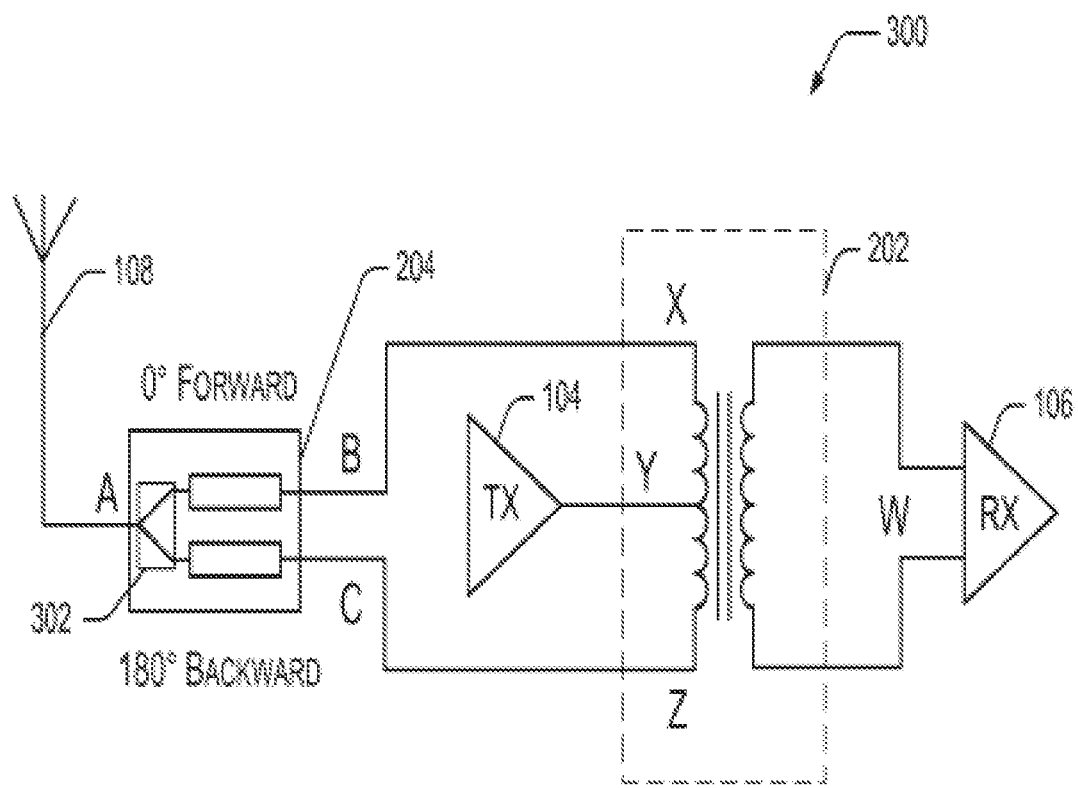
FIG. 3 is a schematic diagram of the filterless broadband isolation arrangement of FIG. 2(a), including example components, according to one implementation.
Figure 4B:
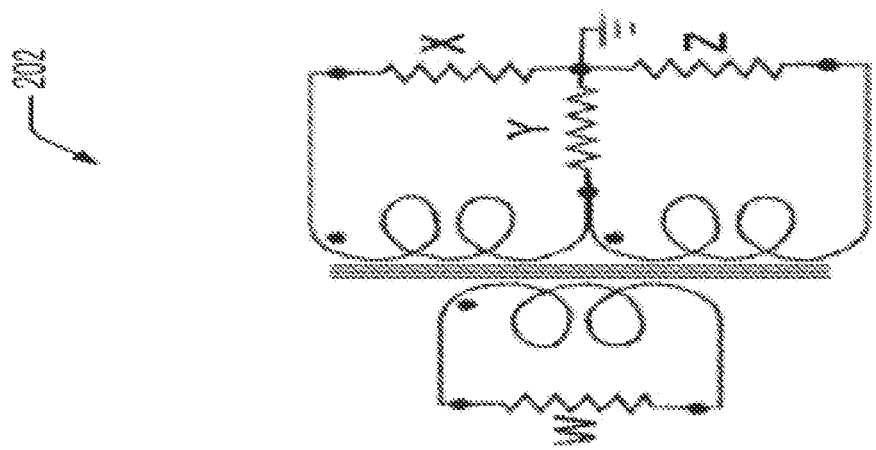
FIGS. 4a and 4b illustrate a schematic of a four port hybrid device (at (a)) and an example hybrid transformer (at (b)) that may be used to implement the four port hybrid device.
Figure 4A:
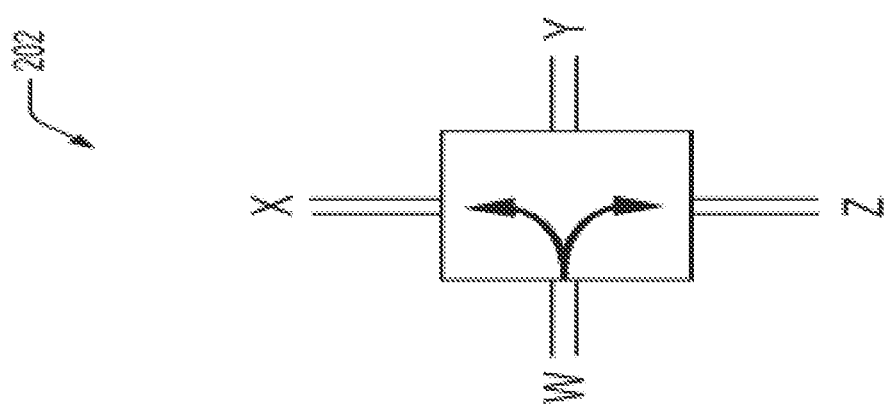

FIG. 3 is a schematic diagram of the filterless broadband isolation arrangement 100 of FIGS. 2(a) and 2(b), including example components, according to one implementation. FIG. 4 illustrates a schematic of a four port hybrid device 202 (at FIG. 4(a)) and an example hybrid transformer (at FIG. 4(b)) that may be used to implement the four port hybrid device 202 of FIG. 4(a).

Referring to FIG. 4, in an implementation, the hybrid device 202 comprises a 4-port passive directional coupler, as shown in FIG. 4(a). For example, as shown in the illustration, the Y and W ports are isolated from each other. A signal input to the hybrid device 202 at ports Y or W will be split to ports X and Z, without being seen at the other of ports Y and W. FIG. 4(b) illustrates this principle, with an example hybrid coil transformer. The isolation of port W from port Y is inherent in the transformer design, as are the signal splitting and combining features. A signal appearing on the W coil will be inductively coupled (at half magnitude, for example, based on the turn ratios of the coils) onto the X and Z coils. Further, it is illustrated with the hybrid coil transformer of FIG. 4(*b*) that a differential signal at port W (the Rx signal portions, for example) will not be seen by the common mode port Y (the Tx component 104 port, for example). In an implementation, the hybrid device 202 comprises a hybrid coil transformer.

In an implementation, the NR shifter 204 is coupled to the antenna 108 at a first terminal "A" and coupled to the third X and fourth Z ports of the hybrid device 202 at second "B" and third "C" terminals, respectively. The NR shifter 204 is arranged to cause a phase change to a signal passing through the NR shifter 204 in one direction, but not cause a phase change to a signal passing through the NR shifter 204 in another direction. For example, in an implementation, the NR shifter 204 is arranged to cause a phase change to a signal passing from the first terminal A to one of the second B and third C terminals and to not cause a phase change to a signal passing from either of the second B or third C terminals to the first terminal A.

As mentioned above, the port and terminal assignments regarding the hybrid device 202 and the NR shifter 204, including the location of various phase shifts, are not intended to be limiting. In alternate implementations, the arrangement and orientation of the ports of the hybrid device 202 and the terminals of the NR shifter 204 may be rotated and/or flipped, and provide the functionality described, particularly when the Tx 104 and Rx 106 are coupled to different ports of the hybrid device 202.

In an implementation, the NR shifter 204 comprises an edge-guided TM-mode, broadband, micro-strip-based, phase shifter module. For example, the NR shifter 204 may include a ferrite substrate, or the like.

In an implementation, the arrangement 100 includes a power splitter/combiner 302 coupled to the NR shifter 204 and arranged to split a signal passing in a first direction with respect to the power splitter/combiner 302 into a pair of signals and to combine a pair of signals passing in a second direction with respect to the power splitter/combiner 302 into a single signal. In one example, the NR shifter 204 includes the power splitter/combiner (e.g., the power splitter/combiner is integral to the NR shifter 204).

For example, during receive mode, the NR shifter 204 with power splitter/combiner 302 is arranged to split the receive signal from the antenna 108 into a pair of differential out-of-phase receive signals, as discussed above. Further, during transmit mode, the hybrid component 202 is arranged to split the transmit signal into a pair of in-phase transmit signals and the power splitter/combiner 302 is arranged to receive the pair of in-phase transmit signals from the third X and fourth Z ports of the hybrid component 202 and to combine the pair of in-phase transmit signals at the antenna 108.

Further implementations may include multiple-input multiple-output (MIMO) arrangements of a system 102. Such implementations can include at least one isolation arrangement 100 to utilize the isolation devices and techniques described.

It is to be understood that a system 102 may be implemented as a separate component or as part of another system including a communication device, for example. The techniques and devices described herein with respect to a system 102 is not limited to the configurations shown in FIGS. 1-4, and may be applied to other configurations without departing from the scope of the disclosure. Various implementations of a system 102 as described herein may include fewer components and remain within the scope of the disclosure. Alternately, other implementations of a system 102 may include additional components, or various combinations of the described components, and remain within the scope of the disclosure.

Representative Process

Figure 5:
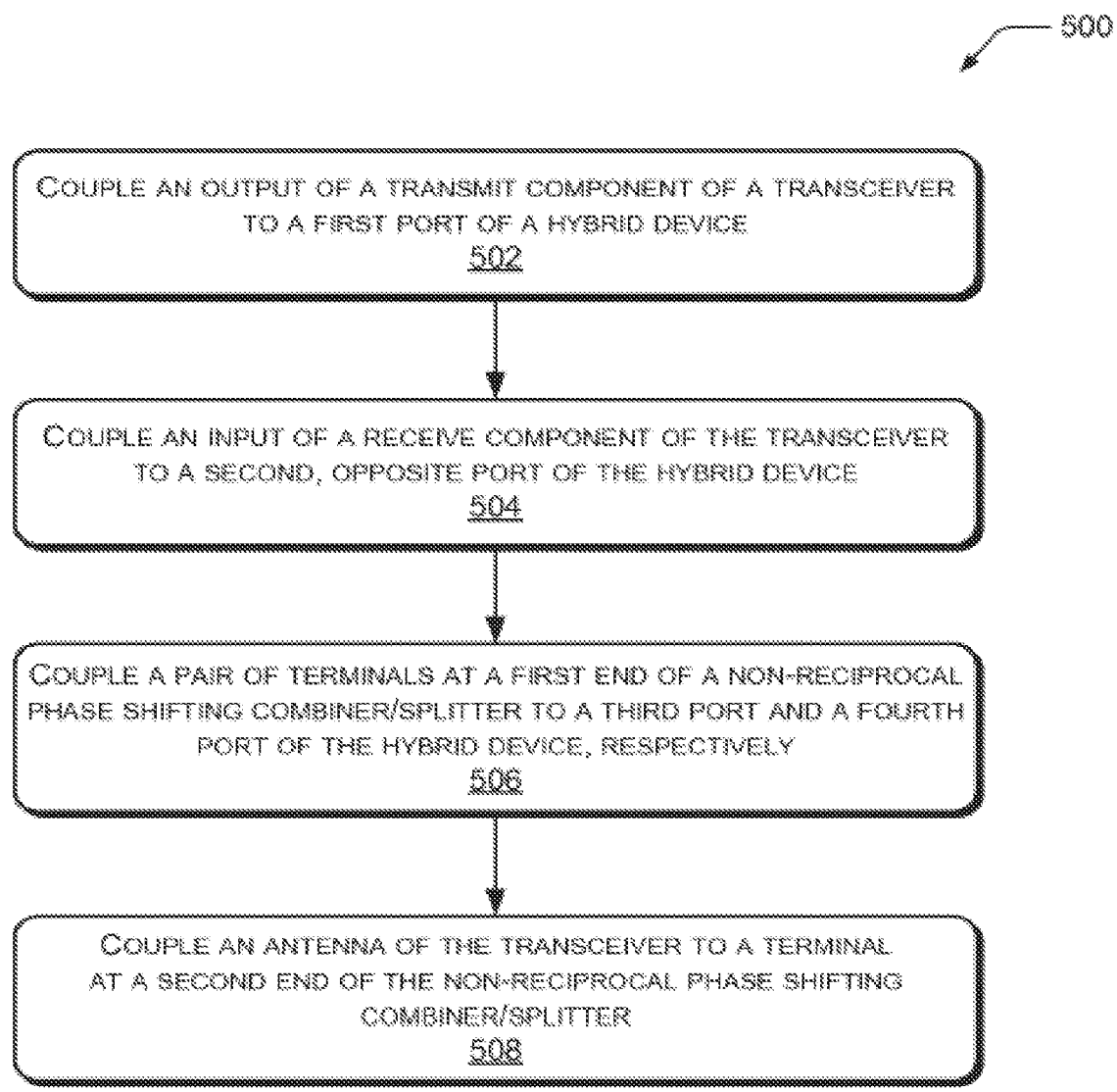
FIG. 5 is a flow diagram illustrating an example process of isolating front-end transmit and receive portions of a broadband communication system, according to an implementation.

FIG. 5 illustrates a representative process 500 of isolating the receive portion and the transmit portion of a broadband wireless communication system (such as system 102, for example) with one or more operative frequency bands, according to an implementation. The process 500 includes splitting some signals, shifting the phase of some split signals, and combining signals both constructively and destructively. In an implementation, the process is performed without the use of filters or switches. The process 500 is described with reference to FIGS. 1-4.

The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable hardware, software, firmware, or a combination thereof, without departing from the scope of the subject matter described herein.

At block 502, the process includes coupling an output of a transmit component (such as transmit component 104, for example) of a transceiver to a first port of a hybrid device (such as hybrid device 202, for example). At block 504, the process includes coupling an input of a receive component (such as receive component 106, for example) of the transceiver to a second, opposite port of the hybrid device. In the implementation, the input of the receive component is isolated from the output of the transmit component by the hybrid device.

At block 506, the process includes coupling a pair of terminals at a first end of a non-reciprocal phase shifting combiner/splitter (such as combination non-reciprocal phase shifter 204 and combiner/splitter 302 for example) to a third port and a fourth port of the hybrid device, respectively. At block 508, the process includes coupling an antenna (such as antenna 108, for example) of the transceiver to a terminal at a second end of the non-reciprocal phase shifting combiner/splitter such that a pair of in-phase transmit signals from the transmit component combine at the antenna through the non-reciprocal phase shifting combiner/splitter, and a receive signal at the antenna is split via the non-reciprocal phase shifting combiner/splitter into a pair of out-of-phase receive signals en route to the receive component.

In an implementation, the process includes generating a transmit signal at the first port of the hybrid device by the transmit component. The process further includes splitting the transmit signal into the pair of in-phase transmit signals, comprising first and second signal portions, via the hybrid device. In an example, the first and second signal portions comprise waveforms having half magnitude of the transmit signal and a same phase as the transmit signal.

In an implementation, the process includes shifting a phase of the first signal portion at the hybrid device, such that the phase-shifted first signal portion has a phase opposite to the second signal portion. The process further includes combining and canceling the phase-shifted first signal portion and the second signal portion at the second port of the hybrid device. Accordingly, the transmit signal is passed to the antenna, but is not passed to the receive component.

In an implementation, the process includes receiving the pair of out-of-phase receive signals, comprising third and fourth signal portions, at the third and fourth ports of the hybrid device, respectively. In an example, the third and fourth signal portions comprise waveforms having half magnitude of the receive signal. However, one of the third and fourth signal portions have a same phase as the receive signal and the other of the third and fourth signal portions has a phase opposite to the phase of the receive signal.

In an implementation, the process includes shifting a phase of a signal passing from the third port to the second port of the hybrid device 180 degrees, and not shifting a phase of a signal passing from the fourth port to the second port or from the third or fourth ports to the first port of the hybrid device. In the implementation, the process includes shifting a phase of the third signal portion at the hybrid device, such that the phase-shifted third signal portion is in phase with the fourth signal portion. Alternately, the process includes shifting a phase of the fourth signal portion at the hybrid device, such that the phase-shifted third signal portion is in phase with the now phase-shifted fourth signal portion.

The process further includes combining the phase-shifted third signal portion and the fourth signal portion at the second port of the hybrid device and receiving the phase-shifted third signal portion and the fourth signal portion at the receive component. Additionally, the process includes combining and canceling the third signal portion and the fourth signal portion at the first port of the hybrid device. Accordingly, the receive signal is passed from the antenna to the receive component, but is not passed to the transmit component.

In an alternate implementation, the process includes an alternate routing of the signals. For example, the alternate routing process includes coupling the receive component to the first port of the hybrid device and coupling the transmit component to the second port of the hybrid device. The alternate process also includes producing a pair of out-of-phase transmit signal portions at the hybrid device, and combining the pair of out-of-phase transmit signals from the hybrid device at the antenna by changing a phase of one of the out-of-phase transmit signals via the non-reciprocal phase shifting combiner/splitter. The process further includes splitting a receive signal at the antenna into a pair of in-phase receive signals by the non-reciprocal phase shifting combiner/splitter, en route to the receive component. Hence, the in-phase receive signal portions are not phase changed at the hybrid device, but are combined at the receive component.

In alternate implementations, other techniques may be included in the process in various combinations, and remain within the scope of the disclosure.

Conclusion

Although the implementations of the disclosure have been described in language specific to structural features and/or methodological acts, it is to be understood that the implementations are not necessarily limited to the specific features or acts described. Rather, the specific features and acts are disclosed as representative forms of implementing the invention.

What is claimed is:

1. An apparatus, comprising:
 a hybrid device including:
  a first port arranged to receive a transmit signal of a transmit component;
  a second port arranged to output a receive signal to an input of a receive component, the first port isolated from the second port; and
  third and fourth ports coupled to an antenna via a non-reciprocal phase shifter, and arranged to output the received transmit signal to the antenna and to receive the receive signal from the antenna; and
 a non-reciprocal phase shifter coupled to the antenna at a first terminal and coupled to the third and fourth ports of the hybrid device at second and third terminals, respectively, and arranged to cause a phase change to a signal passing through the non-reciprocal phase shifter in one direction, but not cause a phase change to a signal passing through the non-reciprocal phase shifter in another direction.

2. The apparatus of claim 1, further comprising a power splitter/combiner coupled to the non-reciprocal phase shifter and arranged to split a signal passing in a first direction with respect to the power splitter/combiner into a pair of signals and to combine a pair of signals passing in a second direction with respect to the power splitter/combiner into a single signal.

3. The apparatus of claim 1, wherein the non-reciprocal phase shifter is arranged to cause a phase change to a signal passing from the first terminal to one of the second and third terminals and to not cause a phase change to a signal passing from either of the second or third terminals to the first terminal.

4. The apparatus of claim 1, wherein the non-reciprocal phase shifter comprises an edge-guided mode, broadband, micro-strip-based, phase shift module.

5. The apparatus of claim 1, wherein the hybrid device is arranged to cause a phase change to a signal passing from one of the third and fourth ports to one of the first and second ports and is arranged to not cause a phase change to a signal passing from either of the third or fourth ports to the other of the first and second ports.

6. The apparatus of claim 1, wherein the hybrid device is arranged to cause a phase change to a signal passing from one of the first and second ports to one of the third and fourth ports and is arranged to not cause a phase change to a signal passing from the other of the first and second ports to either of the third or fourth ports.

7. The apparatus of claim 1, wherein the hybrid device comprises a hybrid coil transformer.

8. The apparatus of claim 1, wherein the apparatus provides at least 40 dB of isolation between the transmit component and the receive component without using a filter or a switch.

9. The apparatus of claim 1, wherein the apparatus provides fron isolation over multiple bands to a multi-band transceiver.

10. A communication system, comprising:
 an antenna;
 a hybrid device arranged to pass a transmit signal from a transmit portion to the antenna and to isolate the transmit signal from a receive portion, and to pass a receive signal from the antenna to the receive portion and to isolate the receive signal from the transmit portion;
 a transmit portion coupled to a first port of the hybrid device and arranged to generate the transmit signal;
 a receive portion coupled to a second port of the hybrid device, the second port isolated from the first port; and
 a non-reciprocal phase shifter coupled to the antenna at a first terminal and coupled to a third port and a fourth port of the hybrid device at a second terminal and a third terminal of the non-reciprocal phase shifter, respectively, and arranged to cause a phase change to a signal passing from the first terminal to one of the second and third terminals and to not cause a phase change to a signal passing from either of the second or third terminals to the first terminal.

11. The system of claim 10, wherein the system comprises a multi-band radio frequency (RF) transceiver.

12. The system of claim 10, wherein the non-reciprocal phase shifter comprises a power splitter/combiner arranged to split the receive signal from the antenna into a pair of differential out-of-phase receive signals.

13. The system of claim 11, wherein the hybrid component is arranged to split the transmit signal into a pair of in-phase transmit signals and the power splitter/combiner is arranged to receive the pair of in-phase transmit signals from the third and fourth ports of the hybrid component and to combine the pair of in-phase transmit signals at the antenna.

14. A method, comprising:
coupling an output of a transmit component of a transceiver to a first port of a hybrid device;
coupling an input of a receive component of the transceiver to a second, opposite port of the hybrid device, the input being isolated from the output of the transmit component by the hybrid device;
coupling a pair of terminals at a first end of a non-reciprocal phase shifting combiner/splitter to a third port and a fourth port of the hybrid device, respectively; and
coupling an antenna of the transceiver to a terminal at a second end of the non-reciprocal phase shifting combiner/splitter such that a pair of in-phase transmit signals from the transmit component combine at the antenna through the non-reciprocal phase shifting combiner/splitter, and a receive signal at the antenna is split via the non-reciprocal phase shifting combiner/splitter into a pair of out-of-phase receive signals en route to the receive component.

15. The method of claim 14, further comprising shifting a phase of a signal passing from the third port to the second port of the hybrid device 180 degrees, and not shifting a phase of a signal passing from the fourth port to the second port or from the third or fourth ports to the first port of the hybrid device.

16. The method of claim 14, further comprising coupling the receive component to the first port of the hybrid device and coupling the transmit component to the second port of the hybrid device, and combining a pair of out-of-phase transmit signals from the hybrid device at the antenna by changing a phase of one of the out-of-phase transmit signals via the non-reciprocal phase shifting combiner/splitter, and splitting a receive signal at the antenna into a pair of in-phase receive signals by the non-reciprocal phase shifting combiner/splitter, en route to the receive component.

17. The method of claim 14, further comprising:
generating a transmit signal at the first port of the hybrid device by the transmit component;
splitting the transmit signal into the pair of in-phase transmit signals, comprising first and second signal portions, via the hybrid device;
shifting a phase of the first signal portion at the hybrid device, such that the phase-shifted first signal portion has a phase opposite to the second signal portion; and
combining and canceling the phase-shifted first signal portion and the second signal portion at the second port of the hybrid device.

18. The method of claim 17, wherein the first and second signal portions comprise waveforms having half magnitude of the transmit signal and a same phase as the transmit signal.

19. The method of claim 14, further comprising:
receiving the pair of out-of-phase receive signals, comprising third and fourth signal portions, at the third and fourth ports of the hybrid device, respectively;
shifting a phase of the third signal portion at the hybrid device, such that the phase-shifted third signal portion is in phase with the fourth signal portion;
combining the phase-shifted third signal portion and the fourth signal portion at the second port of the hybrid device; and
receiving the phase-shifted third signal portion and the fourth signal portion at the receive component.

20. The method of claim 19, wherein the third and fourth signal portions comprise waveforms having half magnitude of the receive signal, one of the third and fourth signal portions having a same phase as the receive signal and the other of the third and fourth signal portions having a phase opposite to the phase of the receive signal.

21. The method of claim 19, further comprising combining and canceling the third signal portion and the fourth signal portion at the first port of the hybrid device.

* * * * *